United States Patent [19]
Hinkle et al.

[11] Patent Number: 5,966,499
[45] Date of Patent: Oct. 12, 1999

[54] SYSTEM FOR DELIVERING A SUBSTANTIALLY CONSTANT VAPOR FLOW TO A CHEMICAL PROCESS REACTOR

[75] Inventors: Luke D. Hinkle, Townsend; D. Jeffrey Lischer, Acton, both of Mass.

[73] Assignee: MKS Instruments, Inc., Andover, Mass.

[21] Appl. No.: 08/901,217

[22] Filed: Jul. 28, 1997

[51] Int. Cl.$^6$ .............................. B01D 7/00; C23C 16/00
[52] U.S. Cl. ...................... 392/388; 118/715; 427/255.1
[58] Field of Search .................. 392/386, 387, 392/388, 394, 396, 400, 401; 118/688, 692, 693, 694, 712, 715, 723 VE, 726, 727; 427/255.1; 261/133, 134, 139, 142, DIG. 65

[56] References Cited

U.S. PATENT DOCUMENTS

| | | | |
|---|---|---|---|
| 3,963,043 | 6/1976 | Cota et al. | 137/487.5 |
| 4,276,243 | 6/1981 | Partus | 392/396 |
| 4,314,837 | 2/1982 | Blankenship | 508/170 |
| 4,529,427 | 7/1985 | French | 118/715 |
| 4,640,221 | 2/1987 | Barbee et al. | 118/692 |
| 4,783,343 | 11/1988 | Sato | 118/692 |
| 5,252,134 | 10/1993 | Stauffer | 118/726 |
| 5,322,710 | 6/1994 | Visser | 427/248.1 |
| 5,371,828 | 12/1994 | Ewing | 392/399 |
| 5,399,200 | 3/1995 | Stauffer | 118/726 |
| 5,451,258 | 9/1995 | Hillman et al. | 118/715 |
| 5,480,488 | 1/1996 | Bittner et al. | 118/692 |
| 5,505,782 | 4/1996 | Stauffer | 118/726 |
| 5,698,037 | 12/1997 | Stauffer | 118/726 |

OTHER PUBLICATIONS

Loan et al., "Advanced Materials Delivery in CVD Processing", *Semiconductor International*, Jul. 1995.

McGraw, "Next–generation CVD Aluminum Precursors Pose New Handling Challenges", *Solid State Technology*, pp. 193–200, Jun. 1997.

Sullivan et al., "Flow Measurement and Control in Vacuum Systems For Microelectronics Processing", *Solid State Technology*, Oct. 1986.

Zorich, "Monitoring Liquid Chemical Levels", *Semiconductor International*, pp. 327–335, Jul. 1997.

Precision 5000® Mark II Etch, Product Improvement Kit: Photoresist Strip and Passivation Chamber Vapor Delivery System, *Applied Materials*, Nov. 1992.

*Primary Examiner*—Teresa Walberg
*Assistant Examiner*—Sam Paik
*Attorney, Agent, or Firm*—Lappin & Kusmer LLP

[57] ABSTRACT

A vapor delivery system for delivering a vapor-phase reactant to a chemical process reactor at a substantially constant flow rate. The vapor delivery system includes a source of a reactant material, means for converting the reactant material to a vapor and for maintaining a predetermined volume of vapor in a vapor phase, a flow controller for providing a controlled flow of the vapor-phase reactant to the process reactor, means for detecting a parameter related to the availability of the vapor-phase reactant material to the process reactor from the flow controller, and means responsive to the detection signal for controlling the supply of reactant material to the vapor converter. In one embodiment the parameter is the pressure of the vapor within the predetermined volume. In another embodiment the parameter is the fluid conductance of a control valve within the flow controller. The vapor delivery system of the present invention can operate in either a substantially continuous or a noncontinuous delivery mode.

39 Claims, 2 Drawing Sheets

SYSTEM FOR DELIVERING A SUBSTANTIALLY CONSTANT VAPOR FLOW TO A CHEMICAL PROCESS REACTOR

FIELD OF THE INVENTION

The present invention relates to the field of fluid flow measurement and control, and more particularly to systems for delivery of a controlled flow of a vapor-phase reactant to a chemical process reactor used for such processes as, for example, vapor deposition, chemical etching, stripping, and passivation.

BACKGROUND OF THE INVENTION

Various chemical processes use precise quantities of materials which must be introduced as vapors into a processing chamber at precisely controlled rates in order to yield a product of a defined composition. For example, in the microelectronics industry, controlled amounts of vaporized precursor materials must be carefully introduced into a chemical process chamber for reaction with other materials and for deposit onto a wafer (such as by condensation). In this and other chemical processes, such as chemical etching, stripping, and passivation, the ability to measure and control the flow of each vaporized precursor is vital for reliable manufacture of products having consistently high performance quality.

Vapors of precursor materials used to manufacture microelectronic and semiconductor devices are typically derived from liquid or solid precursor materials. A suitable delivery pressure for a reactant vapor depends on the vapor pressure of the liquid or solid precursor from which the vapor is derived, as well as the particular requirements of the mass flow controller.

Vapor-phase reactant delivery in about ninety percent of current microelectronics processing applications can be effectively controlled using so-called thermal mass flow controllers. With a thermal mass flow controller, one can determine the rate of laminar fluid flow in a heated channel by measuring the temperature losses from the fluid as it flows through the channel. Temperature measurement of the fluid can be accomplished with any known temperature measuring device, such as, for example, thermistors, thermocouples, and the like. For processes which require operation in a pressure range of $10^{-4}$ torr through atmospheric pressure (760 torr), a flow controller inlet pressure range of 50 torr to several atmospheres, fluid temperatures ranging from ambient through about 40° C., and mass flow rates of $1 \times 10^{-3}$ to 1000 torr-liters/sec, thermal mass flow controllers are highly effective in delivering a controlled flow of vapor to the process reactor.

For delivery of precursor materials to process reactors in systems in which the operating temperatures, pressures and flow rates are outside of these ranges, other devices for controlling mass flow may be more useful or effective. For example, a bubbler may be used to bubble a carrier gas, such as hydrogen or helium, through a source of a heated liquid reactant which is typically provided in a temperature-controlled ampule. The carrier gas bubbles through the liquid reactant in the ampule and becomes saturated with the vapor of the reactant material. It is then delivered to the reaction chamber through heated lines.

A disadvantage of bubblers is the periodic need to refill the ampule with reactant liquid. Replenishment of the ampule with liquid reactant introduces contaminants into the process, as well as batch-to-batch variations in various properties of the material, such as, for example, the viscosity and vapor pressure. The refilling process is messy, time-consuming and labor-intensive, and therefore costly. In addition, as the liquid level in the ampule changes, the ratio of carrier gas to reactant vapor changes also, making it difficult to control the amount of reactant delivered to the process chamber. Another disadvantage is that the bubbler requires a relatively large volume of reactant material which must be maintained at an elevated temperature. Some reactant materials undergo unfavorable chemical reactions or become otherwise unstable if held for prolonged periods of time at the desired maintenance temperatures.

An alternative to bubblers involves the use of a heated ampule of a liquid or solid reactant material. The vapor from the heated reactant material is provided directly to the inlet of a mass flow controller at an appropriate vapor pressure, without a carrier gas. This technique avoids the precise temperature and pressure control requirements of a bubbler and requires only that the reactant temperature be sufficient to deliver the vapor to the mass flow controller at a suitable pressure.

Disadvantages of this technique include those mentioned above relating to replenishment of the reactant material and the need for a relatively high volume of material to be held at an elevated temperature for potentially lengthy periods. In addition, this technique may not be effective for a reactant material whose vapor pressure at the ampule maintenance temperature is relatively close to the total pressure of the reaction chamber. The mass flow controller cannot effectively deliver fluid unless there exists a sufficient pressure differential across it.

Another alternative is to use a liquid flow control device, such as a volumetric displacement pump or a liquid mass flow controller in combination with a reservoir of liquid reactant material, with a downstream vaporizer. The liquid reactant material is provided at substantially ambient temperature, from either a reservoir or an integral distribution system, to a flash vaporizer, and the vaporized reactant is delivered to a process reactor. No temperature control is required for the liquid before it enters the vaporizer.

A disadvantage of this approach is the requirement of a flash vaporizer. In order to deliver a nonfluctuating, controlled flow of a reactant vapor to the process reactor, the vaporizer must operate as a continuous liquid-to-vapor conversion device which responds virtually instantaneously to flow rate changes. In addition, there may be deposition of particles from within the liquid reactant material and the formation of residual films on various vaporizer surfaces during the vaporization process. These events may lead to clogging of the vaporizer and delivery lines and may necessitate their frequent flushing and cleaning.

Alternative devices have been developed to measure and control the mass flow of vapors not suited for measurement by thermal mass flow transducers or the other devices discussed above. These are typically pressure-based mass flow controllers which measure temperature and pressure of a fluid flowing around and/or through a flow restrictor, such as a laminar flow element.

OBJECTS OF THE INVENTION

An object of the present invention is to provide a vapor delivery system which provides a substantially constant vapor flow to a process reactor, regardless of fluctuations in the temperature and pressure of the source material upstream of the mass flow controller.

Another object of the present invention is to provide a vapor delivery system for a chemical process reactor which generates a vapor from a liquid or a solid reactant material at nominal conditions and delivers the vapor to a mass flow controller within a desired range of pressures.

Still another object of the present invention is to provide a vapor delivery system which delivers a vapor-phase reactant to a mass flow controller at a temperature and pressure which are optimized for both the reactant and the mass flow controller.

Yet another object of the present invention is to provide a vapor delivery system which can operate in either a continuous or noncontinuous flow mode.

And still another object of the present invention is to provide a vapor delivery system for a chemical process reactor which substantially eliminates the requirement of a heated reservoir for storage of a liquid or a solid reactant material at a predetermined temperature in order to obtain a suitable vapor pressure for delivery of the vapor-phase reactant to a mass flow controller.

Another object of the present invention is to provide a vapor delivery system in which delivery of the reactant material to a vaporizer, and vaporization of the reactant material, can be carried out in a relatively uncontrolled manner, without affecting the flow rate of vapor to the process reactor.

And yet another object of the present invention is to provide a vapor delivery system for a chemical process reactor in which the pressure of the vapor-phase reactant in a volume downstream of a vaporizer determines and controls the delivery of a liquid or solid reactant material to the vaporizer.

And still another object of the present invention is to provide a vapor delivery system for a chemical process reactor in which information relating to the conductance of flow through a mass flow controller is used to control the delivery of reactant material to an upstream vaporization region.

SUMMARY OF THE INVENTION

The present invention provides an improved vapor delivery system for a chemical process reactor, in which a vapor-phase reactant is delivered to the reactor at a substantially constant flow rate, regardless of fluctuations in temperature and/or pressure of the reactant material upstream.

According to the invention, there is provided a vapor delivery system for delivering a substantially constant flow of a vapor-phase reactant to a chemical process reactor. The system comprises:

a. a source of a reactant material;
  b. a vapor converting apparatus for converting the reactant material to a vapor and for maintaining a predetermined volume of the vapor in a vapor phase;
  c. a flow controller for providing a controlled flow of the vapor to the chemical process reactor;
  d. a device for detecting a parameter related to the availability of the vapor-phase reactant to the process reactor from the flow controller and for providing a detection signal representative of this parameter; and
  e. a control device, responsive to the detection signal, for controlling the delivery of the reactant material to the vapor converting apparatus so as to ensure delivery of the vapor to the flow controller within an acceptable range of temperatures and pressures, and to the process reactor at a substantially constant flow rate.

In one embodiment of the invention, the parameter to be detected is the pressure of the vapor within the predetermined volume. In another embodiment, the parameter is the fluid conductance of a control valve within the flow controller, i.e., the capacity for fluid flow through the valve.

The flow controller includes a fluid flow sensor for sensing the flow rate of fluid through the sensor and for providing a flow rate signal representative of the flow rate, a control valve for controlling the flow of fluid through the sensor, and a valve control signal generating device, responsive to the flow rate signal, for controlling the operation of the control valve.

According to the first-mentioned embodiment of the invention, the vapor delivery system comprises a source of a reactant material, a vapor converting apparatus for converting the reactant material to a vapor and for maintaining a predetermined volume of the vapor in a vapor phase, a flow controller for providing a controlled flow of the vapor-phase reactant to a process reactor, an element for detecting the pressure of the vapor-phase reactant within the predetermined volume and for providing a signal representative of the pressure, and a signal-responsive element which controls the supply of the reactant material to the vapor converting apparatus so as to ensure delivery of the vapor-phase reactant to the flow controller within a range of acceptable temperatures and pressures, and to the process reactor at a substantially constant flow rate.

The reactant material can be either a liquid or a solid at ambient temperature. If a liquid reactant material is used, the vapor delivery system may further comprise a pressurized source of an inert gas, such as argon, nitrogen or helium, and means for applying the gas to the liquid reactant material in order to deliver the liquid reactant to the vapor converting apparatus.

If a solid reactant material is used, the vapor delivery system may further comprise a device, such as a mechanical transport or conveyance system, for feeding the solid reactant, which may typically be in pelletized or granular form, to the vapor converting apparatus. Alternatively, the vapor delivery system may comprise means for providing a liquid solution of the solid reactant precursor material, which can be delivered to the vapor converting apparatus as described above.

The vapor-phase reactant is maintained within a temperature range which permits the vapor to be supplied to the flow controller within an acceptable range of pressures without inducing undesirable chemical reaction of the vapor. An "acceptable" pressure range is determined by the specific properties of the reactant material used, as well as by the operating requirements and characteristics of the mass flow controller used.

The reactant material includes any materials which are suitable for use in various chemical process reactions, including, for example, deposition processes, chemical passivation processes, and stripping and etching processes. The reactant material can be either a solid or a liquid at nominal (ambient) conditions and may be selected from the group consisting of, for example, tetraethyl orthosilicate (TEOS), dimethylamido titanium (TDEAT), tetrakisdimethylamido titanium (TDMAT), dimethylaluminum hydride (DMAH), dimethylethylamine alane (DMEAA), triethylboron (TEB), trimethylphosphine (TMP), titanium tetrachloride ($TiCl_4$), titanium tetraiodide ($TiI_4$), titanium tetrabromide ($TiBr_4$), and water ($H_2O$). Other reactant materials not listed here which can be delivered in the vapor delivery system of the present invention for use in chemical processes are also considered to be within the scope of the invention.

The vapor converting apparatus includes a heat source and an apparatus for vaporizing the reactant material by application of heat to the reactant material. In one embodiment, a flash vaporizer is used to vaporize the reactant material. A typical flash vaporizer includes, for example, a stack of flat, thermally conductive disks in thermal communication with the heat source, and means for contacting the surfaces of the disks with the reactant material to vaporize the reactant material thereon. Other types of flash vaporization apparatus can also be used effectively in the system of the invention.

The signal responsive element comprises a selectively controllable member upstream of the vapor converting apparatus for supplying controlled amounts of the reactant material to the vapor converting apparatus in response to the signal. In a preferred embodiment, the selectively controllable member operates in either a continuous or a noncontinuous delivery mode. For example, reactant material could be supplied to the vapor converting apparatus in a substantially continuous flow, a variable flow, or even a noncontinuous, e.g., or pulsed, flow. If a liquid reactant is used, the selectively controllable member may comprise a valve, such as an injector valve, or like means for delivering controlled amounts of the liquid reactant to the vapor converting apparatus. If a solid reactant is used, the selectively controllable member may comprise a mechanical transport system, such as a conveyor or screw auger.

In the second-mentioned embodiment of the invention, the vapor delivery system comprises a source of a precursor material, a vapor converting apparatus for converting the reactant material into a vapor and for maintaining a predetermined volume of the vapor in a vapor phase, and a flow controller for providing a controlled flow of the vapor to the process reactor. The flow controller includes a fluid flow sensor, a control valve for controlling fluid flow through the sensor, and control valve circuitry for controlling the operation of the valve. The control provides at least one detectable output signal which is representative of the conductance of the control valve. The system further includes a signal-responsive element which uses this conductance information to control the supply of the reactant material to the vapor converting apparatus so as to ensure delivery of the vapor to the flow control element within a range of acceptable temperatures and pressures, and to the process reactor at a substantially constant flow rate.

BRIEF DESCRIPTION OF THE DRAWINGS

The foregoing and other features and advantages of this invention will be better understood from the following detailed description taken with the accompanying drawings, in which.

DETAILED DESCRIPTION OF THE DRAWINGS

There are potentially numerous ways in which the flow rate of a reactant vapor to a chemical process reactor can be maintained substantially constant, as well as potentially numerous ways in which information about the availability of reactant vapor, as provided to the process reactor by the flow controller, can be obtained. Critical to the effectiveness of the present invention is the ability to obtain information about the conditions present at the flow controller, and to use this information to control the delivery of reactant material to the vapor converting apparatus so that substantially continuous flow to the process reactor is established. The conditions present at the flow controller can include, but are not necessarily limited to, for example, the temperature and pressure of the fluid at the inlet and outlet of the controller, the flow rate of the fluid through the flow controller, the design and efficiency of the valve within the flow controller, the conductance, or capacity for fluid flow, of this valve, and other variable conditions. Because there are numerous potential conditions which affect the availability of vapor-phase reactant to the process reactor from the flow controller, yet which vary with time and with change in other variables, it is necessary to evaluate the conditions in the immediate environs of the control valve itself as it supplies vapor-phase reactant to the process reactor in order to control the supply of reactant to the vapor converting apparatus.

Although this invention describes two preferred embodiments, it is considered to encompass all embodiments which fall within the scope of the claims.

Figure 1:
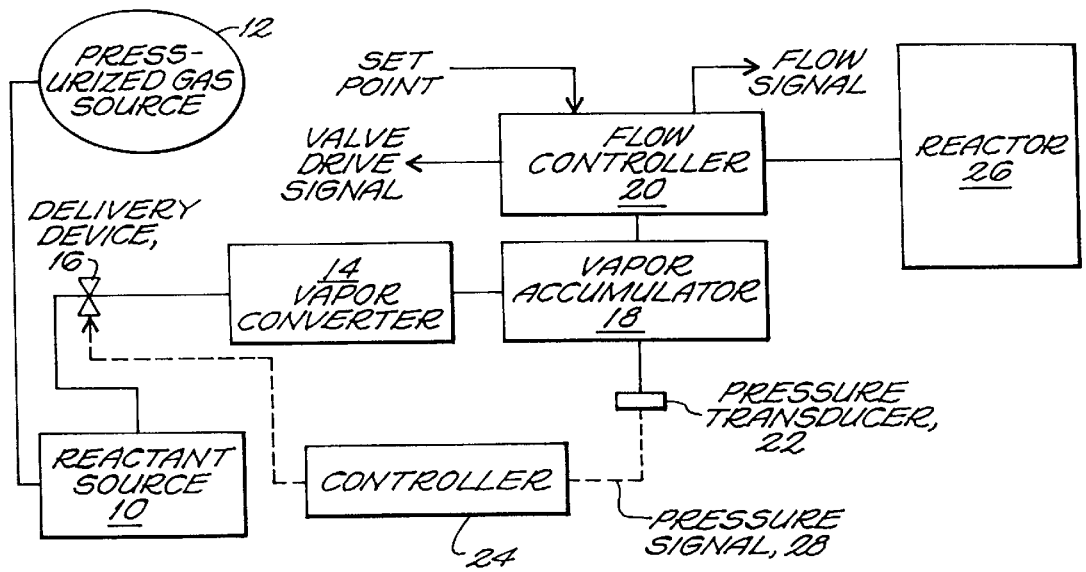
FIG. 1 is a block diagram illustrating a vapor delivery system according to one embodiment of the present invention, in which a pressure transducer detects the pressure of a predetermined volume of a reactant vapor and provides a signal which is used to control the supply of reactant material to a vapor-converting apparatus.

FIG. 1 illustrates a vapor delivery system according to one aspect of the invention. A reactant source 10, such as tetraethyl orthosilicate (TEOS), is provided at a nominally ambient temperature which may range from about 20° C. to about 40° C. A reactant in liquid phase at ambient conditions may be provided in combination with a source 12 of a pressurized gas, such as argon, nitrogen or helium, which acts to propel the reactant to a vapor-converting apparatus 14 through a delivery device 16, such as a liquid control valve. The gas is provided at a positive pressure sufficient to push the reactant material to the vaporization stage of the vapor delivery system. Alternatively, a liquid reactant may be provided through existing lines, such as from a remote distribution system which supplies the reactant at a preselected fluid pressure. This manner of providing the reactant eliminates the need to introduce a pressurized gas into the system to propel the reactant through the vapor delivery system.

The delivery device 16 is adapted for delivery of either solids or liquids. It may be, for example, a valve, such as a solenoid-actuated proportional control valve, or a solid feed mechanism that includes, for example, a conveying wheel or auger or other mechanical transport device for carrying solid material.

The flow of liquid or solid reactant material into the vapor converting apparatus 14 is regulated by the conductance, or capacity for fluid flow through, the delivery device 16.

The vapor converting apparatus 14 may typically comprise a vaporizer, such as a flash vaporizer, which includes, for example, a stack of flat, thermally conductive, horizontally disposed heated disks which are in thermal communication with a heat source (not shown). Such vaporizers are known in the art and form no part of the present invention. A liquid reactant, or a fluidized solid reactant or liquid solution of a solid reactant, enters the center of the stack of disks through a feed tube (not shown) and is vaporized as it passes over the heated surfaces of the disks. The disks are heated to a temperature which is sufficient to convert the reactant material to a vapor. Other types of flash vaporizers can also be used effectively in the vapor delivery system of the present invention.

The vaporized reactant is maintained in a vapor accumulator 18 which has a predetermined volume. The vapor is maintained within a range of temperatures in the accumulator 18 so that the vapor can be supplied to a flow controller 20 within an acceptable range of fluid pressures without undesirable chemical reaction of the reactant vapor. In a preferred embodiment, the vaporizer is maintained at a preselected temperature ranging from 20° C. to 250° C., the specific temperature being determined at least in part by the selection of the reactant material and the type of flow controller.

The vapor accumulator 18 defines a predetermined volume in which the vapor is maintained at a specific temperature so that it can be delivered to a mass flow controller at an appropriate pressure. The functional volume of the accumulator is dependent not only on the actual volumetric capacity of the accumulator, but also on the extent of surface area provided within the accumulator. All surfaces with which the reactant comes in contact after it is vaporized are preferably heated to the nominal temperature of the accumulator. The functional volume of the accumulator may be increased by increasing the surface area within the accumulator with which the vapor comes in contact, so that the vapor can temporarily condense and revaporize.

A pressure transducer 22 monitors the pressure of the vaporized reactant in the accumulator 18 and provides a signal to a controller circuit 24, which controls the operation of the reactant delivery device 16. The pressure transducer 22 can be of any type which converts the pressure of the vapor in the accumulator 18 to a linear DC output voltage. A preferred pressure transducer is a Baratron® variable capacitance absolute pressure transducer, made by MKS Instruments, Inc. (Andover, Mass.).

The flow controller 20 is preferably a pressure-based mass flow controller, although a thermal mass flow controller can also be used. A pressure-based mass flow controller typically includes a solenoid-actuated proportional control valve, at least one capacitance manometer, and a flow restriction element. The temperature of the fluid flowing through the mass flow controller 20, which may be on the order of 100–200° C., is controlled to +/−1 degree. Pressure signal conditioning, flow rate calculations, control circuitry, and other associated electronics may be included, either in an integral or a remote package.

The flow controller 20 delivers the vaporized reactant at a substantially constant flow rate to a chemical process reactor 26, in which various chemical reactions are carried out.

The operation of the vapor delivery system illustrated in FIG. 1 is as follows. Reactant material from reactant source 10 is delivered through delivery device 16 to the vapor converting apparatus 14, where it is vaporized and maintained in accumulator 18 at a predetermined temperature and pressure. The pressure of the vapor in the accumulator 18 is monitored with pressure transducer 22, which sends a signal to controller circuit 24 to admit reactant material through delivery device 16 when the pressure of the vapor in the accumulator 18 drops below a predetermined threshold value. The pressure signal indicates a vapor deficiency condition at the flow controller 20 before the vapor deficiency can affect flow to the process reactor 26 and triggers the delivery of additional reactant material to the vapor converting apparatus 14.

Figure 2B:
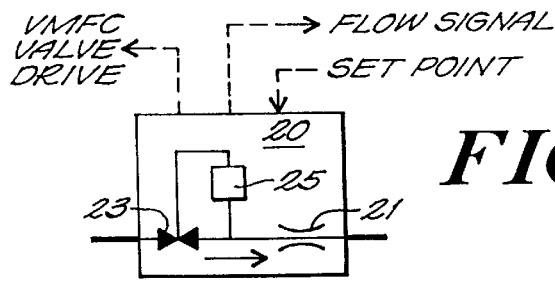
FIG. 2B is a simplified schematic diagram of the mass flow controller and its components.
Figure 2A:
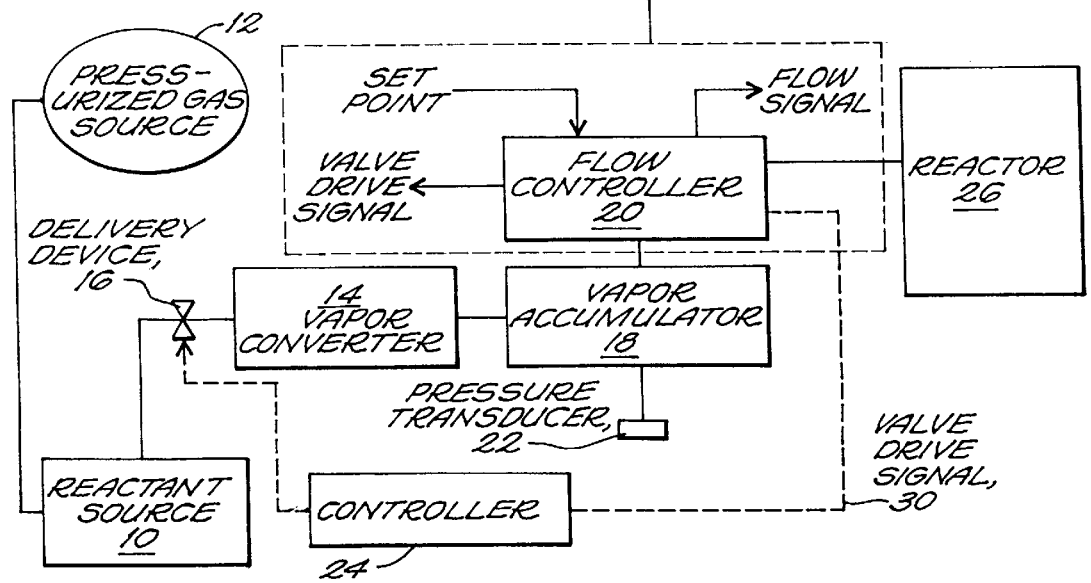
FIG. 2A is a block diagram illustrating a vapor delivery system according to another embodiment of the invention, in which information relating to the conductance of a control valve within a flow controller is used to control the supply of reactant material to a vapor-converting apparatus.

FIG. 2A illustrates a vapor delivery system for a chemical process reactor according to another aspect of the invention. As in the first embodiment, a reactant from a reactant source 10 is provided through delivery device 16 to a vapor converting apparatus 14. As discussed above, a liquid reactant may be combined with a source 12 of pressurized gas which propels the reactant to the vapor converting apparatus. The solid- or liquid-phase reactant is converted to a vapor and maintained within a suitable range of temperatures and pressures in the accumulator 18 so that delivery of the vaporized reactant to the process reactor 26 through a mass flow controller 20 is at a substantially constant flow rate.

The mass flow controller 20 can be considered a variable restriction to fluid flow. As illustrated in FIG. 2B, the mass flow controller 20 typically includes at least one flow sensor 21, a control valve 23, and control valve circuitry 25. The control valve 23 opens and closes in response to a signal provided by the control valve circuitry 25. This control valve drive signal controls and changes the conductance of the control valve 23 by changing its position from fully open, which permits a maximum fluid flow therethrough, to fully closed, which permits no fluid flow therethrough. This valve drive signal can be directed back to the delivery device 16 through controller circuit 24, which compares the valve drive signal to a predetermined threshold value which is preferably set at, for example, some percentage of the fully opened (maximum conductance) position of the control valve 23. When the valve drive signal reaches or exceeds the threshold value, a second signal is sent by the controller circuit 24 to the delivery device 16, which is preferably normally closed in the absence of a signal, to cause it to open, thus initiating or increasing the delivery of liquid or solid reactant to the vapor-converting apparatus 14. As mentioned, the delivery can be in either a continuous or noncontinuous, or pulsed, mode. The reactant is converted to a vapor phase in the vapor converting apparatus 14, and the vapor pressure in the accumulator 18 correspondingly increases. The valve drive signal decreases as the desired flow through the mass flow controller 20 is maintained. This series of events is repeated as needed to provide a substantially constant flow of vapor to the process reactor 26.

The vapor-converting apparatus 14 preferably includes at least one heat source and means for controlling the temperature of each heat source in order to control the vapor conversion process.

The embodiment of FIG. 2A can optionally include a pressure transducer 22 which detects and monitors the pressure of the vapor in the accumulator 18, and can provide a pressure signal, as discussed previously in connection with the embodiment of FIG. 1.

Unlike prior art direct liquid injection systems, in which the delivery of the liquid reactant must be precisely controlled, such as with a positive displacement pump or the like, to effect controlled delivery of reactant to the process reactor, the present vapor delivery system does not require strict control of the delivery of reactant material to the vapor converting apparatus. The vapor delivery system of the present invention supplies the reactant vapor to the process reactor at a substantially constant controlled flow without requiring correspondingly strict control either of the delivery of the reactant to a vaporizing apparatus or of the vaporization process.

Figure 3A:
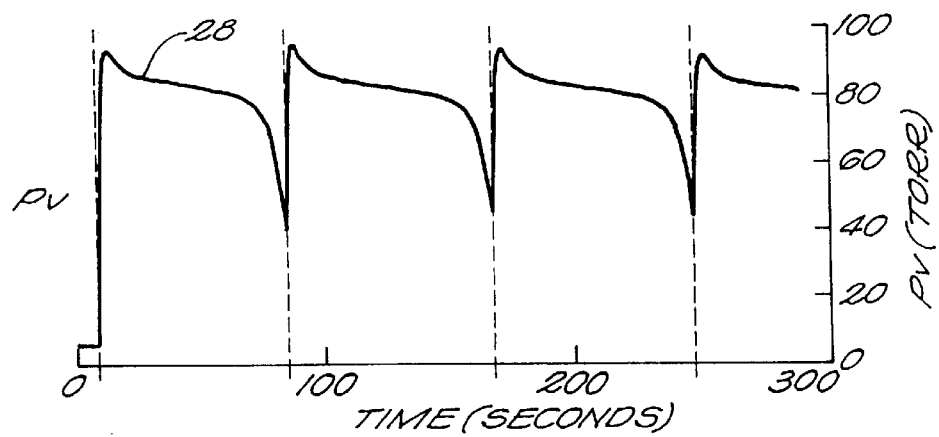
FIG. 3A is a graph illustrating fluid pressure as a function of time in the vapor delivery system illustrated in FIG. 2A.

FIG. 3A illustrates fluid pressure as a function of time in the vapor delivery system as illustrated in FIG. 2A. The pressure of the vapor maintained in the accumulator 18 can be monitored by an optional pressure transducer 22, which provides a pressure signal 28.

Figure 3B:
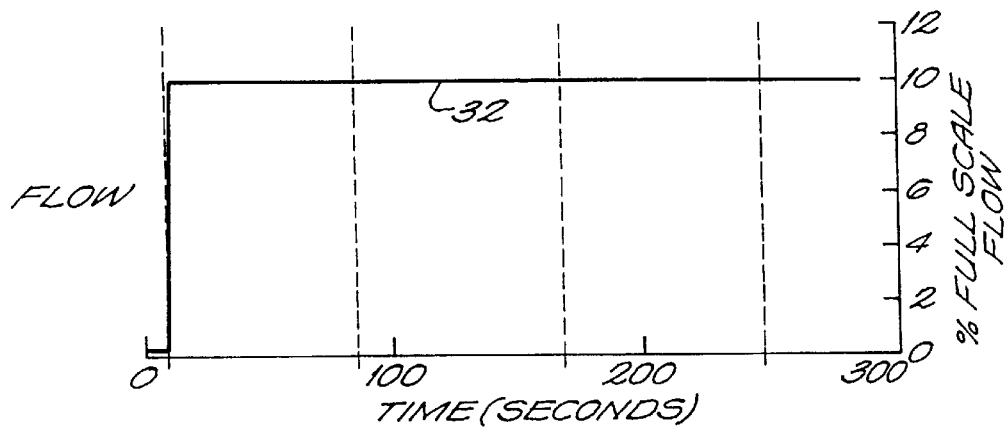
FIG. 3B is a graph illustrating fluid flow as a function of time in the vapor delivery system illustrated in FIG. 2A.

FIG. 3B illustrates fluid flow as a function of time in the vapor delivery system as illustrated in FIG. 2A. The conductance of the flow controller is indicated as a valve drive signal voltage 30, and the fluid flow through the controller to the process reactor is indicated at 32. The dotted line A indicates a threshold value for the valve drive signal 30.

Figure 3C:
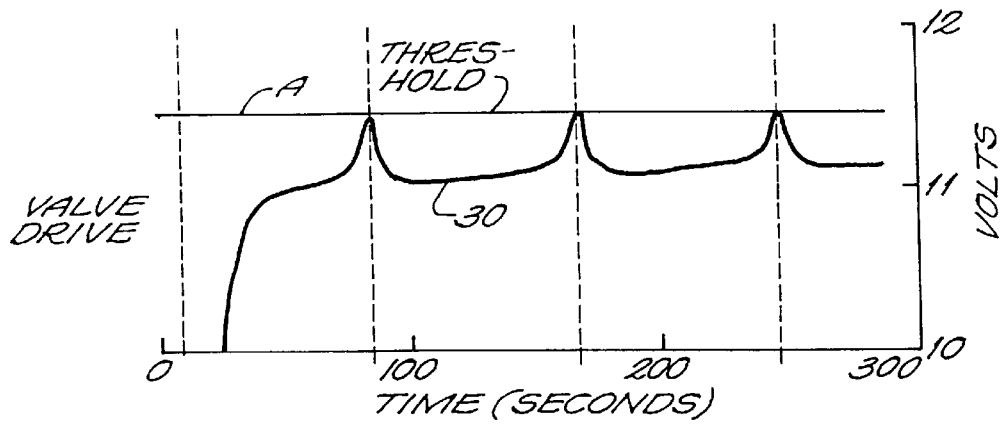
FIG. 3C is a graph illustrating the valve drive signal as a function of time in the vapor delivery system illustrated in FIG. 2A.

FIG. 3C illustrates the behavior of the valve drive signal 30 as a function of time in the vapor delivery system as illustrated in FIG. 2A.

The operation of the vapor delivery system illustrated in FIG. 2A will now be explained with reference to the graphs of FIGS. 3A to 3C. At time t=0, the pressure of the vapor in the accumulator (pressure signal 28), the valve drive signal 30, and the fluid flow signal 32, are all at zero. A set point for desired flow through the flow controller 20 is input, and this command initiates delivery of reactant to the vapor converting apparatus 14. The delivery device 16, normally in a fully closed position, is instructed to open to deliver reactant material to the vapor converting apparatus 14. As heat is applied to vaporize the reactant material in the vapor converting apparatus, the vapor pressure increases in the accumulator 18, as indicated by pressure signal 28. The control valve 23 in the flow controller 20 opens to deliver vapor to the process reactor 26 at a substantially constant flow rate, as indicated by signal 32. As the accumulator pressure decreases, indicated at signal 28, the control valve 23 opens to permit entry of more vapor from the accumulator. This near-maximum conductance condition of the control valve 23, indicated by signal 30, is compared in controller 24 with a predetermined threshold signal, A. When the control valve conductance signal matches the threshold signal A, the controller 24 sends a drive signal to the delivery device 16 upstream of the vapor converting apparatus 14 and accumulator 18 to supply more reactant material to the vapor converting apparatus. Reactant material is then preferably provided in either a continuous or a noncontinuous, e.g., pulsed delivery mode. This addition of reactant material to the vapor converting apparatus 14 causes the pressure of the vapor in the accumulator to increase, as indicated by signal 28.

Once the vapor delivery system is operating as described above, vapor is delivered from the accumulator 18 to the flow controller 20, and the vapor pressure correspondingly decreases in the accumulator. As the pressure in the accumulator drops, the control valve 23 opens to maintain the desired flow through the controller 20. The flow controller conductance signal 30 increases as the valve 23 opens, as shown in FIG. 3C, and more reactant material is admitted to the vapor converting apparatus. The additional reactant is then vaporized, increasing the pressure of the vapor in the accumulator and providing the required vapor supply to the flow controller. This series of events is repeated for the duration of the vapor delivery operation.

The signal 32, indicating flow of vapor-phase reactant to the process reactor 26, reaches a constant value and is maintained there, regardless of fluctuations in the delivery and/or pressure of the reactant material upstream of the flow controller 20.

In both embodiments of the vapor delivery system, the reactant material can be delivered to the vapor converting apparatus 14 in either a substantially continuous or substantially noncontinuous mode, including a pulsed on/off delivery mode, without affecting the flow rate of the vapor-phase reactant to the process reactor 26.

The following non-limiting example is provided to illustrate the principles of the invention.

EXAMPLE I

A vapor delivery system according to the present invention delivers a mass flow rate of 0.804 grams/minute, or 1000 standard cubic centimers per minute (sccm), of water vapor to a process reactor which operates at a pressure of less than 5 Torr.

The water source is a high purity, pressurized distribution system which is part of the overall facility. It is connected directly to an injector valve 16 which is capable of introducing approximately 0.05 grams of liquid per pulse into the vapor converting apparatus 14. Delivery of this nominal amount of liquid reactant per pulse is controlled by the settings of an electrical controller 24 and the conductance of the delivery device 16 for liquid water at the given supply pressure. The vapor converting apparatus 14, vapor accumulator 18, flow controller 20 and interconnecting tubing are heated and temperature-controlled to 90° C. so as to provide a maximum pressure, before condensation occurs, of 526 Torr, as given by the vapor pressure curve for water.

The average power required to vaporize water at this flow rate is 30.33 watts. The additional power required to heat the liquid water from ambient temperature to 90° C. is 3.93 watts. Therefore, in addition to the heat required for temperature regulation of the entire system, a separately regulated heating mechanism is included which is capable of supplying at least 34.26 watts to the vapor converting apparatus 14.

The flow controller 20 is of the type that uses a proportional control valve, an absolute pressure sensor, and a sonic flow nozzle, such as, for example, MKS Type 1150, available from MKS Instruments (Andover, Mass.). It is configured with a 100 Torr full-scale pressure sensor and a 0.0368-inch diameter flow nozzle which provides a 1000 sccm full-scale flow of water vapor to the 5 Torr condition of the process reactor 26 at 90° C. The internal control valve and drive electronics of the flow controller 20 have a continuously variable output signal that ranges from +12 volts when the valve is closed to −12 volts when the valve is fully open and thus driven to its maximum conductance.

In this example, if the valve and associated drive electronics are controlling the internal pressure of the fluid to a 100 Torr set point, and thus a full-scale flow through the nozzle, and the inlet pressure of the fluid to the flow controller 20 is varied, the resulting control valve signal drive responds as shown below:

| Inlet Pressure (Torr) | Control Valve Drive Signal (volts) |
|---|---|
| 500 | −9 |
| 400 | −10 |
| 300 | −11 |
| 200 | −12 |

From this table it can be seen that, as the inlet pressure decreases from 500 Torr to 200 Torr, the control valve drive signal approaches the limit for maximum conductance (−12 volts), or full flow through the valve. If the inlet pressure falls below 200 Torr, the flow controller valve will be in a fully open condition and will be unable to control the flow at full-scale flow.

To ensure that the flow controller 20 is continuously capable of full-scale operation, the comparison threshold, or set point voltage signal, in the controller 24 is set to −11.5 volts. Thus, as the system operates as shown in FIGS. 3A and 3B, the flow controller valve drive signal 30 ranges from −9 volts to −11.5 volts as the pressure of the vapor in the accumulator drops between pulses of reactant delivery, as indicated by signal 28, which shows that the vapor pressure in the accumulator ranges from 250 Torr just before a pulse of liquid reactant is injected and vaporized, to 500 Torr afterward. Since each pulse of liquid reactant delivers approximately 0.05 grams, and the full-scale flow rate is 0.804 grams/minute, the pulse interval is 3.75 seconds. The vapor accumulator 18 must therefore have a functional volume on the order of 200 cubic centimeters (cc) to provide for 0.05 grams (63 standard cc) of water vapor as the pressure decays from 500 to 250 Torr.

Although a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

We claim:

1. A vapor delivery system for delivering a substantially constant flow of a vapor-phase reactant to a chemical process reactor, said system comprising:
   a. a source of a reactant material;
   b. means for converting said reactant material to a vapor and for maintaining a predetermined volume of said vapor in a vapor phase;
   c. means for detecting the pressure of said vapor within said predetermined volume and for providing a signal representative of said pressure;
   d. flow control means for providing a controlled flow of said vapor to said chemical process reactor, and
   e. means responsive to said signal for controlling the delivery of said reactant material to said converting means so as to ensure delivery of said vapor to said flow control element within a range of acceptable temperatures and pressures, and to said process reactor at a substantially constant flow rate.

2. A vapor delivery system according to claim 1, wherein said reactant material is substantially a liquid at ambient temperature.

3. A vapor delivery system according to claim 2, further comprising:
   a. a source of a pressurized gas, and
   b. means for applying said gas to said liquid reactant material so as to deliver said liquid reactant to said vapor converting means.

4. A vapor delivery system according to claim 3, wherein said gas is provided at a pressure which is greater than the pressure of said vapor in said predetermined volume.

5. A vapor delivery system according to claim 1, wherein said reactant material is substantially a solid at ambient temperature.

6. A vapor delivery system according to claim 5, wherein said solid reactant material is in the form of granules or pellets, and wherein said system further comprises means for feeding said solid reactant material to said vapor converting means.

7. A vapor delivery system according to claim 6, wherein said feeding means comprises a mechanical conveying system for delivering said solid reactant material to said vapor converting means.

8. A vapor delivery system according to claim 5, further comprising means for providing a liquid solution of said solid reactant material.

9. A vapor delivery system according to claim 1, wherein said vapor converting means comprises a heat source and means for vaporizing said reactant material by application of heat thereto.

10. A vapor delivery system according to claim 9, wherein said vaporizing means comprises a flash vaporization apparatus.

11. A vapor delivery system according to claim 1, wherein said vapor is maintained in said predetermined volume within a temperature range which permits said vapor to be supplied to said flow control means within an acceptable range of pressures and temperatures without undesirable chemical reaction of said vapor.

12. A vapor delivery system according to claim 1, wherein said flow control means comprises a thermal mass flow controller.

13. A vapor delivery system according to claim 1, wherein said flow control means comprises a pressure-based mass flow controller.

14. A vapor delivery system according to claim 1, wherein said pressure detecting means comprises a variable capacitance absolute pressure transducer.

15. A vapor delivery system according to claim 1, wherein said signal responsive means includes selectively controllable means upstream of said vapor converting means for supplying controlled amounts of said reactant material to said vapor converting means in response to said signal.

16. A vapor delivery system according to claim 15, wherein said selectively controllable means is adapted for operation in substantially continuous, noncontinuous, and pulsed delivery modes.

17. A vapor delivery system according to claim 16, wherein said selectively controllable means comprises a valve for supplying controlled amounts of a liquid reactant material to said vapor converting means.

18. A vapor delivery system according to claim 16, wherein said selectively controllable means comprises a feed mechanism for supplying controlled amounts of a solid reactant material to said vapor converting means.

19. A vapor delivery system for delivering a substantially constant flow of a vapor-phase reactant to a chemical process reactor, comprising:
   a. a source of a reactant material;
   b. means for converting said reactant material to a vapor and for maintaining a predetermined volume of said vapor in a vapor phase;
   c. flow control means for providing a controlled flow of said vapor to said process reactor, wherein said flow control means includes a fluid flow sensor, a control valve for controlling fluid flow through said sensor, and control circuitry for controlling the operation of said control valve, and wherein said control valve includes means for providing at least one detectable output signal representative of the conductance of said control valve; and
   d. means responsive to said signal for controlling the delivery of said reactant material to said vapor converting means so as to ensure delivery of said vapor to said flow control means within a range of acceptable temperatures and pressures, and to said process reactor at a substantially constant flow rate.

20. A vapor delivery system according to claim 19, wherein said reactant material is substantially a liquid at ambient temperature.

21. A vapor delivery system according to claim 20, further comprising:
   a. a source of a pressurized gas, and
   b. means for applying said gas to said liquid reactant material so as to deliver said reactant material to said vapor converting means.

22. A vapor delivery system according to claim 21, wherein said gas is provided at a pressure which is greater than the pressure of said vapor in said predetermined volume.

23. A vapor delivery system according to claim 19, wherein said reactant material is substantially a solid at ambient temperature.

24. A vapor delivery system according to claim 23, wherein said solid reactant material is in the form of granules or pellets, and wherein said system further comprises means for feeding said solid reactant material to said vapor converting means.

25. A vapor delivery system according to claim 24, wherein said feeding means comprises a mechanical conveying system for delivering said solid reactant material to said converting means.

26. A vapor delivery system according to claim 23, further comprising means for providing a liquid solution of said solid reactant material.

27. A vapor delivery system according to claim 19, wherein said vapor is maintained in said predetermined volume within a temperature range which permits said vapor to be supplied to said flow control means within an acceptable range of pressures and temperatures without undesirable chemical reaction of said vapor.

28. A vapor delivery system according to claim 19, wherein said flow control means comprises a thermal mass flow controller.

29. A vapor delivery system according to claim 19, wherein said flow control means comprises a pressure-based mass flow controller.

30. A vapor delivery system according to claim 19, wherein said vapor converting means includes at least one heat source and means for controlling the temperature of each heat source so as to control the conversion of said reactant material to a vapor.

31. A vapor delivery system according to claim 19, wherein said signal responsive means includes selectively controllable means upstream of said vapor converting means for supplying controlled amounts of said reactant material to said vapor converting means in response to said signal.

32. A vapor delivery system according to claim 31, wherein said selectively controllable means is adapted for operation in substantially continuous, noncontinuous, and pulsed delivery modes.

33. A vapor delivery system according to claim 32, wherein said selectively controllable means comprises a valve for supplying controlled amounts of a liquid reactant material to said vapor converting means.

34. A vapor delivery system according to claim 32, wherein said selectively controllable means comprises a feed mechanism for supplying controlled amounts of a solid reactant material to said vapor converting means.

35. A vapor delivery system according to claim 19, further comprising means for detecting the pressure of said vapor within said predetermined volume and for providing a signal representative of said pressure.

36. A vapor delivery system according to claim 35, wherein said pressure detecting means comprises a variable capacitance absolute pressure transducer.

37. A vapor delivery system for delivering a substantially constant flow of a vapor-phase reactant to a chemical process reactor, said system comprising:
   a. a source of a reactant material;
   b. means for converting said reactant material to a vapor and for maintaining a predetermined volume of said vapor in a vapor phase;
   c. flow control means for providing a controlled flow of said vapor to said chemical process reactor;
   d. means for detecting a parameter related to the availability of the vapor-phase reactant to said process reactor from said flow control means and for providing a detection signal representative of said parameter; and
   e. means, responsive to said detection signal, for controlling the delivery of said reactant material to said vapor converting means so as to ensure delivery of said vapor to said flow control means within an acceptable range of temperatures and pressures, and to said process reactor at a substantially constant flow rate.

38. A vapor delivery system according to claim 37, wherein said parameter is the pressure of said vapor within said predetermined volume.

39. A vapor delivery system according to claim 37, wherein said flow control means includes a fluid flow sensor for sensing the flow rate of fluid through said sensor and for providing a flow rate signal representative of said flow rate, a control valve for controlling the flow of fluid through said sensor; and a valve control signal generating device, responsive to the flow rate signal, for controlling the operation of said control valve, wherein said parameter is the fluid conductance of said control valve.

* * * * *